United States Patent
Kim et al.

(10) Patent No.: US 9,904,745 B2
(45) Date of Patent: Feb. 27, 2018

(54) METHOD AND APPARATUS FOR DRIVING SIMULATION OF VEHICLE

(71) Applicant: Hyundai Motor Company, Seoul (KR)

(72) Inventors: Hee Gwon Kim, Seoul (KR); Jeong Woo Lee, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 708 days.

(21) Appl. No.: 14/516,034

(22) Filed: Oct. 16, 2014

(65) Prior Publication Data

US 2016/0012163 A1    Jan. 14, 2016

(30) Foreign Application Priority Data

Jul. 8, 2014 (KR) ................ 10-2014-0085423

(51) Int. Cl.
    *G06F 17/50* (2006.01)
(52) U.S. Cl.
    CPC ...... *G06F 17/5009* (2013.01); *G06F 17/5095* (2013.01)
(58) Field of Classification Search
    None
    See application file for complete search history.

(56) References Cited

U.S. PATENT DOCUMENTS

| | | | | |
|---|---|---|---|---|
| 4,952,152 A | * | 8/1990 | Briggs | ............... G06F 17/5018 348/121 |
| 6,146,143 A | * | 11/2000 | Huston | ................... G09B 9/05 345/620 |

FOREIGN PATENT DOCUMENTS

| | | |
|---|---|---|
| JP | 2000-132084 A | 5/2000 |
| JP | 2003-150038 | 5/2003 |
| JP | 2005-315765 A | 11/2005 |
| KR | 10-0376152 | 3/2003 |
| KR | 10-0438584 | 7/2004 |
| KR | 10-2007-0055253 | 5/2007 |
| KR | 10-0955086 B1 | 4/2010 |

* cited by examiner

*Primary Examiner* — Syed Roni
(74) *Attorney, Agent, or Firm* — Mintz Levin Cohn Ferris Glovsky and Popeo, P.C.; Peter F. Corless

(57) ABSTRACT

A method and an apparatus for driving simulation of a vehicle are provided and obtain various and more accurate simulation data without directly performing a test for an actual vehicle. In particular the apparatus performs the driving simulation of the vehicle based on a power train model and a dynamic model of the vehicle and a road environment model.

15 Claims, 2 Drawing Sheets

METHOD AND APPARATUS FOR DRIVING SIMULATION OF VEHICLE

CROSS-REFERENCE TO RELATED APPLICATION

This application is based on and claims the benefit of priority to Korean Patent Application No. 10-2014-0085423, filed on Jul. 8, 2014 in the Korean Intellectual Property Office, the disclosure of which is incorporated herein in its entirety by reference.

TECHNICAL FIELD

The present disclosure relates to a system and an apparatus for driving simulation of a vehicle, and more particularly, to a technology of performing a vehicle driving simulation in real time based on a power train model and a dynamic model of the vehicle and a road environment model.

BACKGROUND

In general, to develop an automatic transmission, which is one of the main function units within a vehicle, a substantial amount of manpower and equipment are involved. Even when a design of the automatic transmission is completed, processes are repeated in which trial manufactured parts are manufactured to check transmission performance together with entire power performance of the vehicle by mounting the trial manufactured parts within the vehicle and the design is changed at numerous times by supplementing problems. In addition, since information collected during a development process may not be properly managed, the same trial and error may be repeated when new developers work on a project or the development is temporarily stopped and is then resumed.

Therefore, a simulation for performance prediction of the vehicle which decreases a development period and reduces development costs by determining main performance of the vehicle including transmission performance before a field test during the development process is essential. In an apparatus for driving simulation according to the related art, when a variety of data related to an engine, a torque converter, a shift map, a planetary gear, a multiple disk clutch, a multiple disk brake, a clutch working pressure, a driving resistance, a tire, and a specification of the vehicle are input on a computer, the simulation is performed and results are output to a monitor or a printer.

The above-mentioned apparatus for driving simulation according to the related art does not provide motion (behavior) information of the vehicle according to an input of a driver as well as fuel efficiency information.

SUMMARY

The present disclosure provides a method and an apparatus for driving simulation of a vehicle that obtain various and more accurate simulation data without directly performing a test for an actual vehicle, by performing the driving simulation of the vehicle based on a power train model and a dynamic model of the vehicle and a road environment model.

According to an exemplary embodiment of the present disclosure, an apparatus for driving simulation of a vehicle may include: a driver input unit configured to receive driver instructions via a steering wheel, an accelerator pedal, and a brake pedal; an input value detector configured to detect a steering value that corresponds to a manipulation of the steering wheel, an acceleration value that corresponds to a manipulation of the accelerator pedal, and a braking value that corresponds to a manipulation of the brake pedal; a first calculator configured to calculate a torque value by applying the steering value, the acceleration value, and the braking value to a power train model of the vehicle; a second calculator configured to calculate a speed and a position of a virtual vehicle by applying the torque value to a dynamic model of the vehicle; a third calculator configured to calculate a real time position, a speed, and an acceleration of the virtual vehicle by applying the position to a road environment model; and a controller configured to operate driving of the virtual vehicle on a screen based on the real time position, the speed, and the acceleration of the virtual vehicle.

According to another exemplary embodiment of the present disclosure, a method for driving simulation of a vehicle may include: receiving, by a driver input unit, driver instructions via a steering wheel, an accelerator pedal, and a brake pedal; detecting, by an input value detector, a steering value that corresponds to a manipulation of the steering wheel, an acceleration value that corresponds to a manipulation of the accelerator pedal, and a braking value that corresponds to a manipulation of the brake pedal; calculating, by a first calculator, a torque value by applying the steering value, the acceleration value, and the braking value to a power train model of the vehicle; calculating, by a second calculator, a speed and position of a virtual vehicle by applying the torque value to a dynamic model of the vehicle; calculating, by a third calculator, a real time position, a speed, and an acceleration of the virtual vehicle by applying the position to a road environment model; and operating, by a controller, driving of the virtual vehicle on a screen based on the real time position, the speed, and the acceleration of the virtual vehicle.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, exemplary embodiments of the present disclosure will be described in detail with reference to the accompanying drawings.

Figure 1:
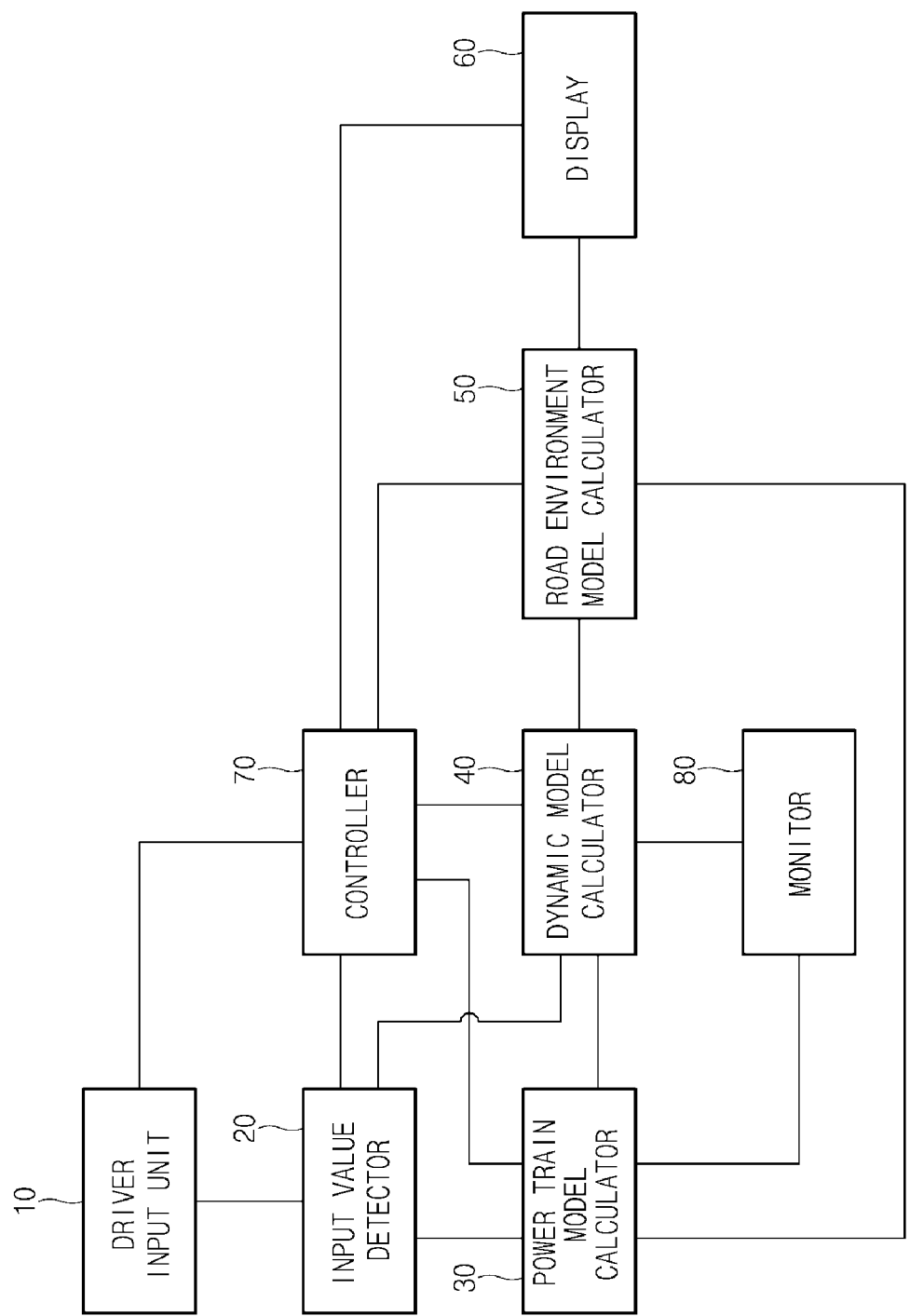
FIG. 1 is an exemplary configuration diagram of an apparatus for driving simulation of a vehicle according to an exemplary embodiment of the present disclosure.

FIG. 1 is an exemplary configuration diagram of an apparatus for driving simulation of a vehicle according to an exemplary embodiment of the present disclosure. As shown in FIG. 1, the apparatus for driving simulation of the vehicle according to the exemplary embodiment of the present disclosure may include a driver input unit 10, an input value detector 20, a power train model calculator 30, a dynamic model calculator 40, a road environment model calculator 50, a display 60, a controller 70, and a monitor 80. The controller 70 may be configured to operate the driver input unit 10, the input value detector 20, the power train model calculator 30, the dynamic model calculator 40, the road environment model calculator 50, the display 60, and the monitor 80.

Describing the above-mentioned respective components, first, the driver input unit 10, which is a simulation driving module, may be configured to receive driver instructions via a steering wheel, an accelerator pedal, and a brake pedal. For reference, since the simulation driving module, which is an equipment implemented in the same form as a driver seat of the actual vehicle, may include the steering wheel, the accelerator pedal, and the brake pedal, the driver may perform a driving manipulation in the same form as the actual driving by manipulating the steering wheel, the accelerator pedal, and the brake pedal.

Further, the input value detector 20 may be configured to detect the instructions of the driver, received via the driver input unit 10. In other words, the input value detector 20 may be configured to detect steering values (e.g., steering torque, steering angle) that correspond to a manipulation of the steering wheel when the steering wheel is manipulated, detect an acceleration value that corresponds to a manipulation of the accelerator pedal when the accelerator pedal is manipulated (e.g., engaged, disengaged, or engaged at different levels), and detect a braking value that corresponds to a manipulation of the brake pedal when the brake pedal is manipulated (e.g., engaged or disengaged).

The power train model calculator 30 may be configured to store a power train model of the vehicle and apply the values detected by the input value detector 20 to the power train model to calculate a result. As an example, the power train model calculator 30 may be configured to calculate a torque value by applying one or more of the steering value, the acceleration value, and the braking value to the power train model. In particular, the power train model may include function blocks such as an engine, a transmission, a differential mechanism, and the like and transmission of data between the function blocks may be performed. For example, the torque value output from the transmission may be input to the differential mechanism and a speed may be fed back from the differential mechanism to the transmission. In addition, the power train model calculator 30 may be configured to calculate fuel efficiency based on the speed fed back from the dynamic model calculator 40. In particular, the fuel efficiency may include accumulated fuel efficiency as well as instant fuel efficiency.

The dynamic model calculator 40 may be configured to store a dynamic model of the vehicle and apply the values calculated by the power train model calculator 30 to the dynamic model to calculate a result. As an example, the dynamic model calculator 40 may be configured to calculate a speed and position of a virtual vehicle by applying the torque value to the dynamic model. In particular, the dynamic model calculator 40 may be configured to feed back the calculated speed to the power train model calculator 30 and transfer the calculated position of the virtual vehicle to the road environment model calculator 50. In addition, the dynamic model calculator 40 may be configured to calculate lateral acceleration and longitudinal acceleration of the virtual vehicle based on the steering value, the acceleration value, the braking value detected by the input value detector 20 and the position calculated by the power train model calculator 30.

Furthermore, the road environment model calculator 50 may be configured to store a road environment model and apply the values calculated by the dynamic model calculator 40 to the road environment model to calculate a result. As an example, the road environment model calculator 50 may be configured to calculate a real time position of the virtual vehicle by applying the position of the virtual vehicle calculated by the dynamic model calculator 40 to the road environment model. The road environment model calculator 50 may also be configured to calculate a speed and acceleration of the virtual vehicle based on changed positions (e.g., time-based positions) of the virtual vehicle.

The display 60 may be executed by the controller 70 to display (e.g., output) the simulation results. In particular, the simulation results may be displayed on a screen as an image in which the virtual vehicle is traveling on the road, and one or more of instant fuel efficiency, accumulated fuel efficiency, motion information, speed, and revolutions per minute (RPM) of the virtual vehicle may also be displayed on the screen. In particular, the motion information may be used as data used to detect a driving style of the driver. In other words, when changes in the lateral acceleration and the longitudinal acceleration of the virtual vehicle are substantially frequent (e.g., occur more than a predetermined number of times), the driving style of the driver may be determined as an aggressive driving style, when a change in the lateral acceleration is substantially frequent (e.g., occurs more than a predetermined number of times), the driving style of the driver may be determined as a defensive driving style, and when a change in the longitudinal acceleration is substantially frequent (e.g., occurs more than a predetermined number of times), the driving style of the driver may be determined as a normal driving style.

Additionally, the controller 70 may be configured to operate the respective components to allow the respective components to normally (e.g., without error) perform their respective functions. Particularly, the controller 70 may be configured to operate the display 60 to display an image in which the virtual vehicle is traveling on the road, based on the position, the speed, and the acceleration calculated by the road environment model calculator 50. In other words, the controller 70 may be configured to adjust the driving of the virtual vehicle on the screen. Additionally, the monitor 80 may be configured to monitor the results calculated by the power train model calculator 30 and the results calculated by the dynamic model calculator 40. Further, the monitor 80 may be configured to store monitored data.

Figure 2:
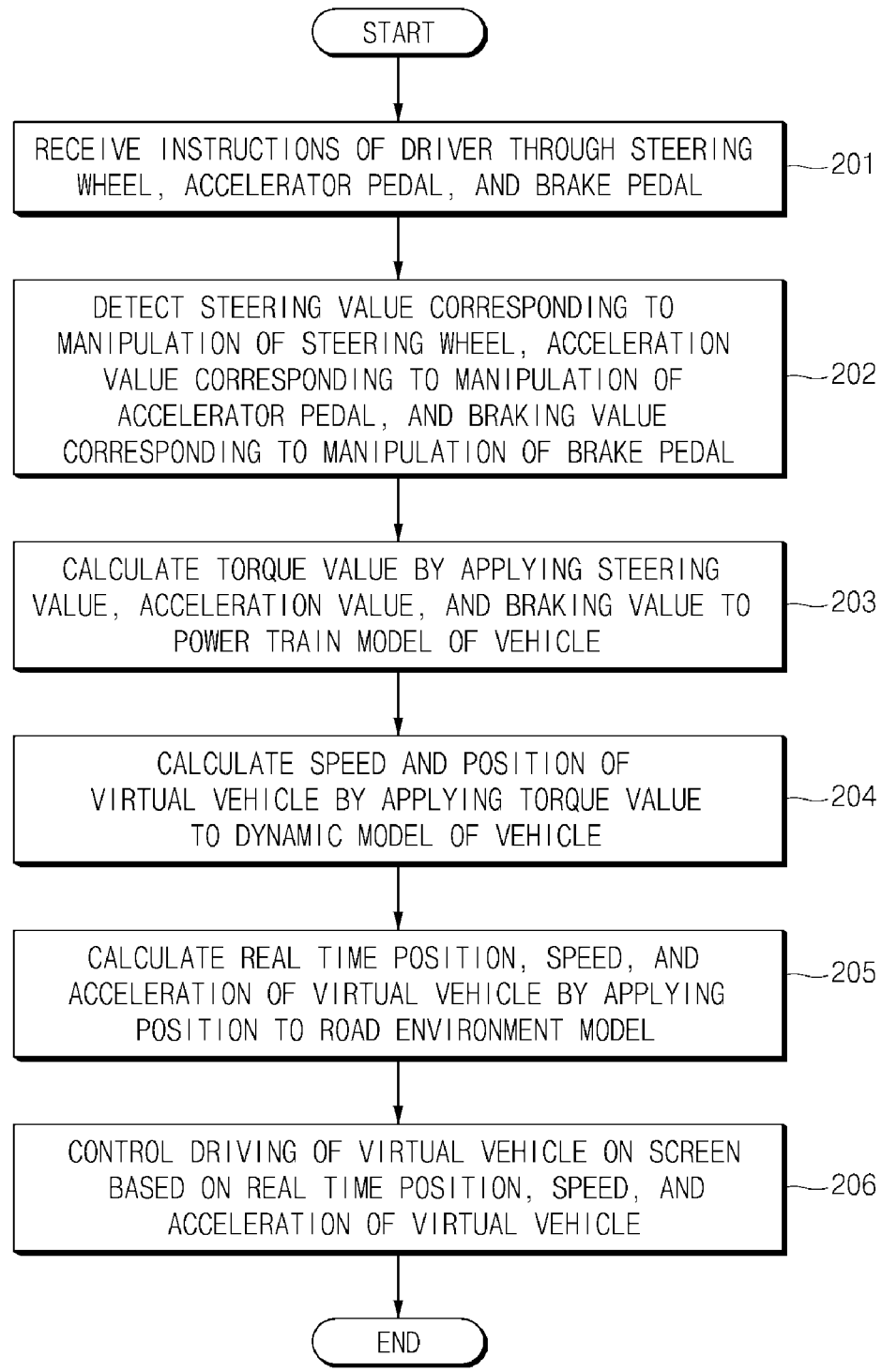
FIG. 2 is an exemplary flow chart of a method for driving simulation of a vehicle according to an exemplary embodiment of the present disclosure.

FIG. 2 is an exemplary flow chart of a method for driving simulation of a vehicle according to an exemplary embodiment of the present disclosure. First, the driver input unit 10 may be configured to receive driver instructions via a steering wheel, an accelerator pedal, and a brake pedal (201). The input value detector 20 may be configured to detect a steering value that corresponds to a manipulation of the steering wheel, an acceleration value that corresponds to a manipulation of the accelerator pedal, and a braking value that corresponds to a manipulation of the brake pedal (202).

Further, the power train model calculator 30 may be configured to calculate a torque value by applying the steering value, the acceleration value, and the braking value to the power train model of the vehicle (203). The dynamic model calculator 40 may be configured to calculate a speed and position of a virtual vehicle by applying the torque value to the dynamic model of the vehicle (204). The road environment model calculator 50 may be configured to calculate a real time position, a speed, and an acceleration of the virtual vehicle by applying the position to the road environment model (205). In addition, the controller 70 may be configured adjust the driving of the virtual vehicle on the screen, based on the real time position, the speed, and the acceleration calculated by the road environment model calculator 50 (206).

As described above, according to the exemplary embodiments of the present disclosure, the various and more accurate simulation data may be obtained without directly performing the test for the actual vehicle by performing the driving simulation of the vehicle based on the power train model and the dynamic model of the vehicle and the road environment model.

What is claimed is:

1. An apparatus for driving simulation of a vehicle, comprising:
   a memory storing program instructions; and
   a processor configured to execute the program instructions, the program instructions when executed configured to:
   receive driver instructions via a steering wheel, an accelerator pedal, and a brake pedal;
   detect a steering value that corresponds to a manipulation of the steering wheel, an acceleration value that corresponds to a manipulation of the accelerator pedal, and a braking value that corresponds to a manipulation of the brake pedal;
   calculate a torque value by applying the steering value, the acceleration value, and the braking value to a power train model of the vehicle;
   calculate a speed and a position of a virtual vehicle by applying the torque value to a dynamic model of the vehicle;
   calculate a real time position, a speed, and an acceleration of the virtual vehicle by applying the position of the virtual vehicle to a road environment model; and
   adjust driving of the virtual vehicle on a screen based on the real time position, the speed, and the acceleration of the virtual vehicle,
   wherein the adjustment of the driving of the virtual vehicle includes displaying a lateral acceleration and a longitudinal acceleration of the virtual vehicle as data used to detect a driving style of the driver.

2. The apparatus according to claim 1, wherein the program instructions when executed are further configured to calculate a fuel efficiency of the virtual vehicle based on the speed of the virtual vehicle.

3. The apparatus according to claim 2, wherein the fuel efficiency includes instant fuel efficiency and accumulated fuel efficiency.

4. The apparatus according to claim 1, wherein the program instructions when executed are further configured to calculate lateral acceleration and longitudinal acceleration of the virtual vehicle based on the detected steering value, the detected acceleration value, and the detected braking value and the calculated torque value.

5. The apparatus according to claim 1, wherein the program instructions when executed are further configured to monitor the torque value and the speed and position of the virtual vehicle.

6. A method for driving simulation of a vehicle, comprising:
   receiving, by a controller via a driver input unit, driver instructions via a steering wheel, an accelerator pedal, and a brake pedal;
   detecting, by the controller, a steering value that corresponds to a manipulation of the steering wheel, an acceleration value that corresponds to a manipulation of the accelerator pedal, and a braking value that corresponds to a manipulation of the brake pedal;
   calculating, by the controller, a torque value by applying the steering value, the acceleration value, and the braking value to a power train model of the vehicle;
   calculating, by the controller, a speed and position of a virtual vehicle by applying the torque value to a dynamic model of the vehicle;
   calculating, by the controller, a real time position, a speed, and an acceleration of the virtual vehicle by applying the position of the virtual vehicle to a road environment model; and
   adjusting, by the controller, a driving of the virtual vehicle on a screen based on the real time position, the speed, and the acceleration of the virtual vehicle,
   wherein the adjustment of the driving of the virtual vehicle includes displaying a lateral acceleration and a longitudinal acceleration of the virtual vehicle as data used to detect a driving style of the driver.

7. The method according to claim 6, wherein the calculation of the torque value includes calculating a fuel efficiency of the virtual vehicle based on the speed of the virtual vehicle.

8. The method according to claim 7, wherein the fuel efficiency includes instant fuel efficiency and accumulated fuel efficiency.

9. The method according to claim 6, wherein the calculation of the speed and the position of a virtual vehicle includes calculating lateral acceleration and longitudinal acceleration of the virtual vehicle based on the steering value, the acceleration value, the braking value, and the torque value.

10. The method according to claim 6, further comprising:
monitoring, by the controller, the torque value and the speed and position of the virtual vehicle.

11. A non-transitory computer readable medium containing program instructions executed by a controller, the computer readable medium comprising:
program instructions that receive driver instructions via a steering wheel, an accelerator pedal, and a brake pedal;
program instructions that detect a steering value that corresponds to a manipulation of the steering wheel, an acceleration value that corresponds to a manipulation of the accelerator pedal, and a braking value that corresponds to a manipulation of the brake pedal;
program instructions that calculate a torque value by applying the steering value, the acceleration value, and the braking value to a power train model of the vehicle;
program instructions that calculate a speed and a position of a virtual vehicle by applying the torque value to a dynamic model of the vehicle;
program instructions that calculate a real time position, a speed, and an acceleration of the virtual vehicle by applying the position of the virtual vehicle to a road environment model; and
program instructions that adjust driving of the virtual vehicle on a screen based on the real time position, the speed, and the acceleration of the virtual vehicle,
wherein the adjustment of the driving of the virtual vehicle includes displaying a lateral acceleration and a longitudinal acceleration of the virtual vehicle as data used to detect a driving style of the driver.

12. The non-transitory computer readable medium of claim 11, wherein the calculation of the torque value includes calculating a fuel efficiency of the virtual vehicle based on the speed of the virtual vehicle.

13. The non-transitory computer readable medium of claim 12, wherein the fuel efficiency includes instant fuel efficiency and accumulated fuel efficiency.

14. The non-transitory computer readable medium of claim 11, wherein the calculation of the speed and the position of a virtual vehicle includes calculating lateral acceleration and longitudinal acceleration of the virtual vehicle based on the steering value, the acceleration value, the braking value, and the torque value.

15. The non-transitory computer readable medium of claim 11, further comprising:
program instructions that monitor the torque value and the speed and position of the virtual vehicle.

* * * * *